United States Patent [19]
Knoch et al.

[11] Patent Number: 5,999,028
[45] Date of Patent: Dec. 7, 1999

[54] DIFFERENTIAL CIRCUITS WITH ADJUSTABLE PROPAGATION TIMING

[75] Inventors: Ulrich Knoch, Boeblingen; Thorsten Krueger, Rottenberg, both of Germany; Barbara Duffner; Ronnie Owens, both of Ft. Collins, Colo.; Charles Moore, Loveland, Colo.

[73] Assignee: Hewlett-Packard Company, Palo Alto, Calif.

[21] Appl. No.: 08/995,886

[22] Filed: Dec. 22, 1997

[51] Int. Cl.$^6$ ................................ H03K 5/12; G06G 7/10
[52] U.S. Cl. .................... 327/165; 327/362; 327/563; 326/29
[58] Field of Search ........................ 327/65, 89, 307, 327/362, 563, 165, 175; 330/9, 252, 253, 261; 326/21, 29

[56] References Cited

U.S. PATENT DOCUMENTS

| | | | |
|---|---|---|---|
| 4,464,631 | 8/1984 | Prentice | 330/256 |
| 4,717,888 | 1/1988 | Vinn et al. | 330/261 |
| 4,827,222 | 5/1989 | Hester et al. | 330/261 |
| 4,987,327 | 1/1991 | Fernandez et al. | 327/543 |
| 5,045,806 | 9/1991 | Yan | 330/252 |
| 5,132,559 | 7/1992 | Baskett | 327/66 |
| 5,812,005 | 9/1998 | Ezell et al. | 327/307 |

*Primary Examiner*—Timothy P. Callahan
*Assistant Examiner*—Terry L. Englund

[57] ABSTRACT

Described is a circuit for receiving a differential input signal at two substantially symmetrically built up current paths and for providing an output signal therefrom. At least one current path comprises means for adjusting the timing information of the input signal to the timing information of the output signal. The adjustment can be accomplished by modifying a voltage level in the respective current path until the timing information of the output signals at least substantially represents the timing information of the input signal, e.g. by modifying an impedance or a current in the respective current path. The adjusting of the timing information is executed by applying a defined input signal with a known timing information, comparing the timing information of the resulting output signal with the timing information of the input signal, and modifying at least one voltage level in at least one of the current paths until the timing information of the output and input signals at least substantially match.

2 Claims, 6 Drawing Sheets

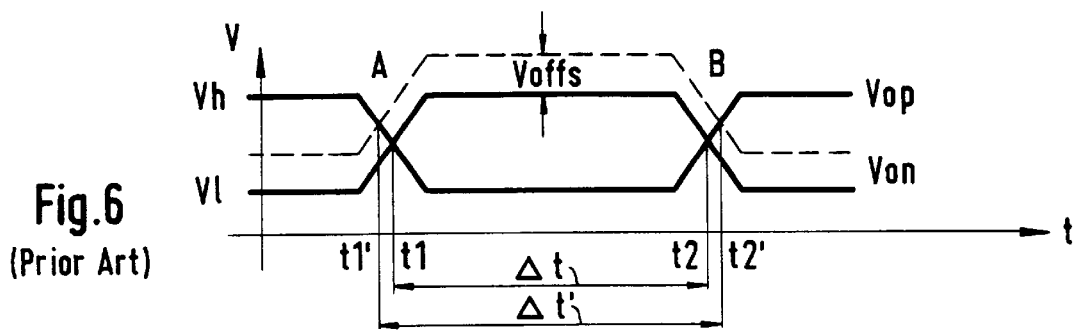
Fig.6
(Prior Art)
Fig.7a
(Prior Art)
Fig.7b
(Prior Art)
Fig.7c
(Prior Art)
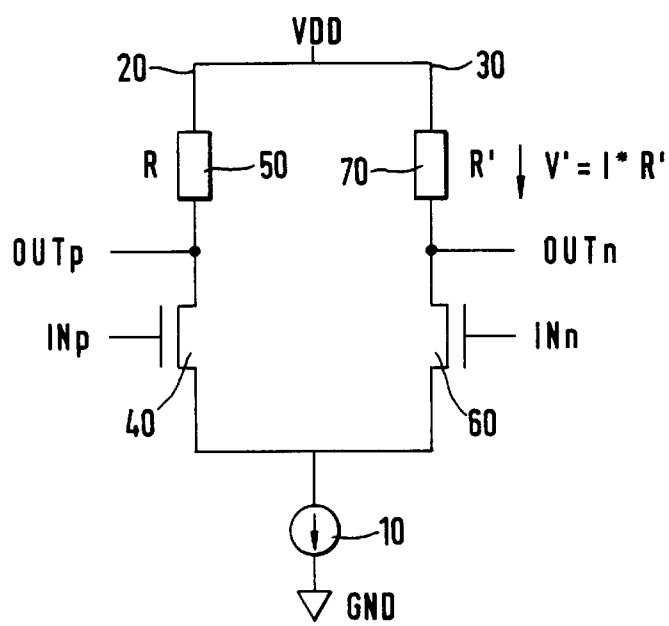
Fig.8a

DIFFERENTIAL CIRCUITS WITH ADJUSTABLE PROPAGATION TIMING

BACKGROUND OF THE INVENTION

The present invention generally relates to differential digital circuits and the timing behavior thereof.

Digital circuits are normally operated in a two-level, or binary, mode. This means that at a steady state, each input and output is in one of two conditions. These conditions (or states) are often referred to as true or false states, high ($V_h$) or low ($V_l$) levels, or '1' or '0' states, respectively. Because circuit outputs are generally voltages, these two states are characterized by two voltage ranges based on a higher voltage $V_{ih}$ and a lower voltage $V_{il}$, where $V_{ih} > V_{il}$. The voltages $V_{ih}$ and $V_{il}$ are also called the high and low logic thresholds. It is agreed that—as shown in FIG. 1—if a nodal voltage V satisfies the inequality $V > V_{ih}$, then the node is in a high state, and if $V < V_{il}$, the node is in a low state.

For some applications, the two-level mode has been proved insufficient, and instead thereof, a differential logic is applied. In digital circuits using the differential logic (also referred hereafter as differential digital circuits, or simply differential circuits), the signal voltage is defined as the difference between two node voltages $V = V_p - V_n$. For the logic state of V, the conditions as described for the two-level mode apply. In a steady state, the two node voltages $V_p$ and $V_n$ of the differential logic always have opposite states, i.e. if $V_p > V_{ih}$ then $V_n < V_{il}$, and vice versa. Among other advantages, circuits applying differential logic generally exhibit constant power supply current, a comparably low voltage swing and thus high speed, low susceptibility to noise and comparably low noise generation.

Differential circuits, including the differential digital circuits, have formerly been implemented in bipolar technologies such as in ECL (emitter-coupled logic) circuits. ECL is often used in computers that require high speed. To achieve such high speeds, ECL consumes a large amount of electric power, requiring expensive cooling. Current trends in the electronic industry towards higher integration and smaller systems also force an application of differential circuits in MOS (metal oxide semiconductor) technologies. The main differences between bipolar and MOS transistors, used to implement differential circuits, are the following. A single IC chip cannot be packed with as many transistors in ECL as in MOS. If too many transistors are placed on an ECL chip, it becomes damaged by the excessive heat. MOS chips consume very little power if the signals do not change with a very high frequency; therefore, a large number of transistors can be packed onto a single chip. Further more, MOS transistors show higher threshold voltages and a lower transconductance at comparable speed and power supply currents.

FIG. 2 shows an inverter circuit as an example for a differential digital circuit. A current source 10 feeds a first current path 20 and a second current path 30. The first current path 20 comprises a first current switch 40 and a first load 50, and the second current path 30 comprises a second current switch 60 and a second load 70. The first 40 and second 60 current switches are normally embodied by transistor elements, such as bipolar or MOS transistors, and receive at their control electrodes differential input signals $IN_p$ and $IN_n$, respectively. The first 50 and second 70 load may also be embodied by transistor elements, such as MOS transistors, or by other resistor means as known in the art. Each one of the current paths 20 and 30 respectively provides a differential output signal $OUT_p$ or $OUT_n$ at a node between the current switches and the load.

In operation, the higher signal of the differential input signals $IN_p$ and $IN_n$ switches on the respective one of the current switches 40 or 60, so that the potential of the output signal ($OUT_p$ or $OUT_n$) in that current path will be drawn from a higher to a lower potential. Accordingly, the lower signal of the differential signals $IN_p$ and $IN_n$ switches off the other one of the current switches 40 or 60, so that the potential of the output signal in that current path will be drawn from a lower to a higher potential. The circuit of FIG. 2 thus inverts the differential input signals $IN_p$ and $IN_n$.

It is clear that the function of the circuit in FIG. 2 can be modified by exchanging the input signals or the output signals resulting in a non-inverting buffer.

In general, a state transition is a change of a node voltage from a first state to a second state, where in a digital circuit the state transition normally is between two defined states. FIG. 3 shows an example for such a state transition. The time while a voltage is in a range between the threshold voltages $V_{ih}$ and $V_{il}$ is called the transition time $t_{tr}$. For physical reasons the transition time must be non zero, $t_{tr} > 0$.

The point in time when a voltage reaches $V = (V_{ih} + V_{il})/2$ is generally referred to as a timing mark of the transition. For differential signals, the timing mark is the point in time, when the differential signals are equal. In FIG. 3, the transition starts at a time $t_1$ and ends at a time $t_3$, whereby at a time $t_2$ the two differential signals are equal and reach the voltage $(V_{ih} + V_{il})/2$. The transition time is defined as $t_{tr} = t_3 - t_1$. The transition mark of that transition is at $t_2$.

Timing information is transmitted or processed when signals change from one state to another and generally comprises information about timing marks. A digital circuit, which is processing or transmitting timing information, generates a sequence of output state transitions as a result of a sequence of input state transitions. Output state transitions occur at times $t_o(1), t_o(2) \ldots t_o(N)$ caused by input state transitions that occur at times $t_i(1), t_i(2) \ldots t_i(N)$, as depicted in FIG. 4a.

The relationship between timing information of input transitions must be reflected at the output of the system. Further more, the time elapsing between input state changes should also elapse between output state changes caused by their respective input state changes. Otherwise the system has changed the timing information which should be avoided in most applications. Thus, a digital circuit generates accurate timing, if the following equation for the transition times is satisfied:

$$t_o(k+1) - t_o(k) = t_i(k+1) - t_i(k), \text{ where } k \text{ is an integer.} \quad (\text{eq.1})$$

The time difference between a timing mark $t_i(k)$ of a transition at an input of a system or device, and a timing mark $t_o(k)$ of a thereto corresponding output transition is called the propagation delay $t_{pd}(k)$, with $t_{pd}(k) = t_o(k) - t_i(k)$. For an ideal digital circuit, the propagation delay is a constant value with $t_{pd}(k) = t_{pd}(k+n)$ where n is an integer. However, in real digital circuits the propagation delay $t_{pd}(k)$ might differ depending on the actual input state, the frequency of state changes at the input, and so forth.

In particular when digital electronic circuits are used for time measuring, e.g. in testing applications for testing e.g. integrated circuits (IC's) or other electronic devices, it is crucial for the operation that the circuits provide an accurate timing, i.e., the variation of the propagation delay $t_{pd}(k)$ should be small with respect to the transition time of the signal to be measured, transmitted or otherwise processed.

The propagation delay $t_{pd}(k)$ of a differential circuit is commonly defined as the time elapsing between corresponding time marks, i.e the point in time when $V_i=0$ or $V_{ip}=V_{in}$ and the point in time when $V_o=0$ or $V_{op}=V_{on}$, as depicted in FIG. 4b. This is in accordance with the time elapsing between the transition timings as described above.

Miniaturization of electrical circuits is generally envisaged since miniaturization means not only that a higher integration of the circuits can be achieved, but also that higher frequencies can be applied due to the smaller feature sizes. However, with an increased integration and miniaturization of differential circuits, it has been found that the timing behavior, such as the propagation delay $t_{pd}(k)$, significantly starts to vary, even between identical differential circuits. Further more, it was detected that e.g. the propagation delay $t_{pd}(k)$ turns out to diverge and not to be a constant value for a specific circuit, so that the timing information will be changed by that circuit. This leads to timing defects which are completely unacceptable for most applications, and in particular, for timing sensitive applications such as in testing applications.

Specifically since differential circuits are mainly used for high precision applications, the effect of an unpredictable timing behavior has been found as an enormous drawback for that technology. However, a reason for that variation in timing behavior could not have been sufficiently given in the art, so that the circuit designers had to either accept only a certain degree of integration and miniaturization, or to use different technologies.

SUMMARY OF THE INVENTION

It is an object of the invention to provide differential circuits which allow a higher integration and miniaturization. The object is solved by the features of the independent claims. Preferred embodiments are given in the dependent claims.

By analyzing the problem of a varying timing behavior when miniaturizing differential circuits, it was found that the operation and thus the timing behavior of the differential circuits strongly depends on the symmetry of the differential circuit, so that a variation of parameters of individual devices within the differential circuit might cause a variation in the behavior of the entire circuit. Whereas in low integration circuits the statistical variation of the elements during their manufacturing process generally lies in between the normal tolerances of the elements, so that the symmetry is substantially balanced, it could be shown that in higher integration circuits the statistical variation of the elements might lead to a significant asymmetry of the differential circuits which statistically increases with a higher integration and miniaturization. If for example a gate length in a high integration circuit is reduced from e.g. 1.2 μm to 0.6 μm, and a typical variation resulting from the manufacturing process is 20 nm, the relative tolerance is increased from 1.5% to 3%. However, to achieve the necessary speed for certain applications, the feature sizes (such as the gate length) have to be decreased.

In a MOS application, such as the inverter of FIG. 2, a variation of the threshold voltage of a MOS transistor will cause an input offset voltage, whereas a variation in the trans-conductance of a MOS transistor will cause an output offset voltage. With a certain simplification, the effect of asymmetry between the first current path 20 and the second current path 30 can be expressed by an offset voltage $V_{offs}$ which covers any asymmetry of corresponding elements between the first 20 and second 30 current path. FIG. 5 depicts the inverter of FIG. 2 with an offset voltage $V_{offs}$ due to an asymmetry between the first current path 20 and the second current path 30, whereby the offset voltage $V_{offs}$ can result, e.g., from an input offset voltage, an output offset voltage, or a combination thereof.

The effect of the offset voltage $V_{offs}$ on the timing information in the circuit is depicted in FIG. 6. One of the two input signal is shifted (indicated by a dotted line) by the offset voltage $V_{offs}$, e.g., due to a variation of the threshold voltage of a transistor. The timing mark of a first transition A (rising edge for $V_{on}$) is shifted from a timing mark $t_1$ (without offset voltage $V_{offs}$) to a timing mark $t_{1'}$ (with the offset voltage $V_{offs}$). Accordingly, the timing mark of a second transition B (falling edge for $V_{on}$), which is in the opposite direction to the first transition A, is shifted from a timing mark $t_2$ (without offset voltage $V_{offs}$) to a timing mark $t_{2'}$ (with the offset voltage $V_{offs}$). However as apparent from FIG. 6, since the timing mark $t_{1'}$ has been shifted in the opposite direction as the timing mark $t_{2'}$ (with respect to their 'original signals'), the time difference $\Delta t = t_2 - t_1$ has been changed to a time difference $\Delta t' = t_{2'} - t_{1'}$. It can thus be seen that the offset voltage $V_{offs}$ leads to a relative shifting of the voltage levels in one current path and accordingly to a change of the timing information, since the timing marks of rising edges and falling edges are shifted in opposite directions.

FIGS. 7a to 7c show the effect of the offset voltage $V_{offs}$ on the timing information. The initial timing information is depicted in the timing diagram of FIG. 7a. FIG. 7b shows the timing information after being passed through a differential circuit with the offset voltage $V_{offs}$ in one current path, however in an idealized timing diagram without propagation delay. FIG. 7c eventually shows the effect of the offset voltage $V_{offs}$ with propagation delay. Each rising edge is delayed by a substantially constant propagation delay $t_{pd}(r)$, whereas each falling edge is delayed by a substantially constant propagation delay $t_{pd}(f)$. Although the timing information in FIG. 7c is delayed by a constant delay time $t_d$ with respect to FIG. 7b, it is apparent that the propagation delays $t_{pd}(r)$ and $t_{pd}(f)$ are not equal.

It has further been found that other effects, which might not lead to a substantially constant offset voltage $V_{offs}$, can also change the timing information of the input information. For example different output capacities e.g. at output nodes $OUT_p$ and $OUT_n$ can also lead to a variation in the propagation delay for different timing edges.

According to the invention, the effect of a change in timing information, e.g. due to the offset voltage $V_{offs}$, is compensated by modifying a voltage level in at least one current path, e.g., the levels of $V_{ip}$ and/or $V_{in}$. The voltage level(s) will be modified until the timing information of the output signals at least substantially represents the timing information of the input signal. This allows to compensate asymmetry effects in differential circuits due to device tolerances during the manufacturing process, so that the differential circuits become applicable also for higher integration densities of the circuits without changing the timing information of the applied signals.

The compensation—in principal—can be executed by applying a defined input signal with a known timing characteristics at the input of the circuit to be compensated. The timing characteristics of the resulting output signal is compared with the timing characteristics of the input signal and the at least one voltage level in at least one of the current paths is modified until the timing characteristics of the output and input signals match. The timing characteristics is preferably adjusted by comparing the propagation delays of the rising and falling edges. In a preferred embodiment, the applied input signal has a duty cycle signal of about 50%.

The duty cycle of the output signal is measured and compared with the input signal. The at least one voltage level in at least one of the current paths is then modified until the duty cycle of the output signal exhibits about 50%.

For a more precise compensation, each current path might be modified to a certain extent, or each pair of corresponding components can be compensated by modifying at least one component of that pair.

The compensation of the change in timing information can be accomplished by two principle ways for a trimming circuit. According to Ohm's Law, a voltage level V can be modified by either changing the impedance R—as a first principle way—or the respective current I—as a second principle way.

Following the first principle way for a trimming circuit, at least one impedance R in at least one of the current paths is modified. The modification of the impedance R (e.g. a resistor or a load device) can be achieved, e.g., by switching as many devices in parallel or series as is necessary to adjust the timing error, by adjusting the control voltage of a transistor to modify the impedance, by switching at least one (e.g. FET) transistor in parallel and adjusting its control voltage to modify the impedance, or by other means as known in the art.

FIG. 8a shows the principle for adjusting at least one impedance R' in one current path in an example for the inverter circuit of FIG. 2, whereby the effect thereof is depicted in FIG. 8b. As apparent from the dotted line ($V_{on'}$) of the output voltage $OUT_n$ in FIG. 8b, a variation of the impedance R' leads to an offset voltage $V_{offs'}$ at $V_l$ ($V_h$ will remain without influence) and to a different angle of the rising and falling edges during a transition with respect to the symmetrical situation when R'=R, as depicted by the (continuous) line $V_{on}$. Accordingly, the time marks of the transitions vary when changing the impedance R'. By changing the value of the impedance R', the propagation delay for the rising and the falling edges can thus be adjusted to be substantially equal, so that the timing information of the output signals represents the timing information of the input information.

The adjusting of the impedance has the advantage that basically no additional power within the circuit to be compensated is required. The power dissipation is determined by the differential current driving the cell anyway.

Following the second principle way for a trimming circuit, at least one current I of the current paths is modified, i.e. at least one adjustment current i is added to at least one of the current paths. The modification of the current can be achieved, e.g., by switching at least one (e.g. FET) transistor between one current path and a lower potential such as ground and adjusting its control voltage for adjusting the value of the current i, or by other current means as known in the art. Adding a constant (adjustment) current asymmetrically is preferably achieved by switching transistors from nodes $OUT_p$ and $OUT_n$ to a ground potential.

FIG. 9a shows the principle for adjusting at least one current I' in one current path by adding one adjustment current i in an example for the inverter circuit of FIG. 2, whereby the effect thereof is depicted in FIG. 9b. As apparent from the dotted line ($V_{on''}$) of the output voltage $OUT_n$ in FIG. 9b, a variation of the current I' leads to an offset voltage $V_{offs''}$ with respect to the symmetrical situation when R'=R, as depicted by the (continuous) line $V_{on}$. However in comparison to the offset voltage $V_{offs'}$ in FIG. 8b, the offset voltage $V_{offs''}$ is superimposed through the whole range of the output voltage $OUT_n$. The propagation delay for the rising and the falling edges can thus be adjusted to be substantially equal.

The current modification according to the invention, although requiring additional current and thus power with respect to the impedance modification, exhibits lower load capacitances. Another advantage is that NFETs may be used as current sources. They can be smaller in this case and they also add less capacitive load to the output node, due to their dopant density.

In a preferred embodiment of the invention, the adjustment of the current paths is accomplished by pulling the voltage level of the output signal in one of the current paths to a lower level. The circuit therefore comprises adjustment means in each current path, so that only the current path with the higher voltage level of the output signal will be drawn to a lower level. In another embodiment, the voltage level of both output signals is pulled to a lower level. Accordingly, in an 'upside down configuration', e.g. when using PFETs as switches and NFETs as loads, the voltage level may be pulled to a higher level. The magnitude of e.g. the current drawn on each side may be adjusted by switching on a respective number of transistors in each current path until adjustment has been reached. Both embodiments allow an easier embodiment for the adjustment, since no active elements are required.

It is clear that the impedance and current adjustment can be applied concurrently, or that in one current path an impedance adjustment may be carried out whereas a current adjustment is applied in the other current path.

FIG. 9c depicts the principle for the timing adjustment according to the invention in an example. The input signals $V_{ip}$ and $V_{in}$ are shown in solid lines. Depicted as dotted lines are the timing behaviors of the (already adjusted) output signals $V_{op}$ and $V_{on}$. It is to be understood that for the sake of simplicity, the internal delay of the output signals $V_{op}$ and $V_{on}$ with respect to the input signals $V_{ip}$ and $V_{in}$ is omitted, so that the timing marks $t_1$ and $t_2$ of the input and the output signals coincide. That means that the input and the output signals exhibit the same timing information and thus the same propagation delay for the rising and falling edges.

As apparent from FIG. 9c in combination with FIGS. 8a, 8b and 9a, 9b, the voltage level $V_{op}$ at output node $OUT_p$ in the current path 20 has been adjusted by changing the current I (FIG. 9a) e.g. by adding a current source i between output node $OUT_p$ and ground potential. In contrast thereto, the voltage level $V_{on}$ at output node $OUT_n$ in the current path 30 has been adjusted by changing the value of the impedance 70 (FIG. 9a) e.g. by connecting one or more further impedances in parallel. The adjustment in current path 20 and 30 is executed until the timing information of the output signals represents the timing information of the input signals, or in other words, until the corresponding time difference $\Delta t = \Delta t'(=t_2-t_1)$ between the timing marks is the same for the input and the output information (compare FIG. 6). However, as can be seen in FIG. 9c, the result of the compensation needs not necessarily be that the adjusted output signals $V_{op}$ and $V_{on}$ are symmetrical.

The effect of the compensation in general can be explained by the following. If e.g. the signal $V_{op}$ is changed to $V_{op'}=V_{op}+V_{omodp}$, the point in time when $V_{op'}=V_{on}$, which is relevant for the timing, also changes. If $V_{on}$ is changed to $V_{on'}=V_{on}+V_{omodn}$, the point in time when $V_{op}=V_{on'}$ will also change. Accordingly, if as well the signal $V_{op}$ is changed to $V_{op'}=V_{op}+V_{omodp}$ and the signal $V_{on}$ is changed to $V_{on'}=V_{on}+V_{omodn}$, the point in time when $V_{op'}=V_{on'}$ will be modified.

During a linear rising transition, the voltage of a signal can be described by $$V(t)=V_f+\partial V/\partial t * t \quad (\text{eq.2})$$

The voltage V starts at a level $V_f$ and rises linearly with the time until it reaches its steady state high level $V_h$ (compare FIG. 6). A falling transition can be described by $$V(t)=V_h-\partial V/\partial t * t \quad (\text{eq.3})$$

If the crossing point of the unmodified signals $V_{op}$ and $V_{on}$ is a timing mark $t_1$ $V_{op'}$ follows eq. 2 and $V_{on'}$ follows eq. 3, a timing mark $t_{1'}$ as the crossing point where $V_{op'}=V_{on'}$ can be calculated as $$t_{1'}=t_1+(V_{omodp}-V_{omodn})/(\partial V/\partial t) \quad (\text{eq.4})$$

If $t_{1'}$ is the resulting timing mark of the transition A (compare FIG. 6), and $t_2$ is the initial timing mark of transition B. the resulting timing mark $t_{2'}$ of the transition B can be calculated as $$t_{2'}=t_2-(V_{omodp}-V_{omodn})/(\partial V/\partial t) \quad (\text{eq.5})$$

The output level change in the differential circuit can be achieved applying Ohm's Law:

$$V=I*R \quad (\text{eq.6})$$

If V is to be modified, either I or R can be changed. This leads to the two ways of implementation of the trimming circuit as explained above, with e.g.:

1. an asymmetrical modification of the load devices or R'=R+dR (where dR is the change in resistance R) in the above equation as shown in FIGS. 8a and 8b;
2. an asymetrical addition of a constant current dI (where dI is the change in resistance R) such as adjustment current i in FIGS. 9a and 9b.

It is to be understood that the invention does not merely compensate the offset voltage $V_{offs}$ as depicted e.g. in FIG. 5, but provides tools for adjusting the timing behavior of a differential circuit in order that the timing information of an applied input signal will not be changed by the circuit. The result of the compensation according to the invention may even be that an existing offset voltage $V_{offs}$ will be increased, or even that the compensation will lead to an offset voltage $V_{offs}$ which has not been there before (cf. FIG. 9c). However, the inventive compensation will decrease or even eliminate timing defects due to a change of the timing information of the input signal.

The invention thus allows to provide differential circuits which exhibit an improved or even close to ideal timing behavior, even when going to a higher integration and miniaturization. This permits to apply high integration circuits without the need for compromising speed and timing accuracy.

It is to be understood that the compensation according to the invention can be applied to any kind of differential circuits or logical gates, such as XORs, flip-flops, or the like, and is not limited to the inverter circuit as depicted in FIG. 2 which is used herein for the sake of simplicity only.

BRIEF DESCRIPTION OF THE DRAWINGS

Other objects and many of the attendant advantages of the present invention will be readily appreciated and become better understood by reference to the following detailed description when considering in connection with the accompanied drawings, in which:

FIGS. 6, 7a to 7c show the effect of the offset voltage $V_{offs}$ on the timing information, FIGS. 8a and 8b show the principle and effect for adjusting at least one impedance R' in one current path of the inverter circuit of FIG. 2, according to the invention.

DETAILED DESCRIPTION OF THE INVENTION

Figure 1:
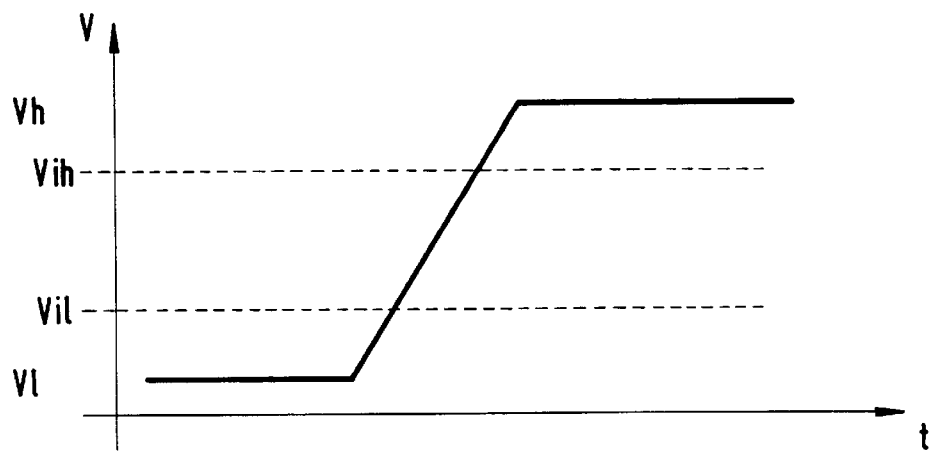
FIG. 1 shows a transition between high and low logic thresholds.
Figure 2:
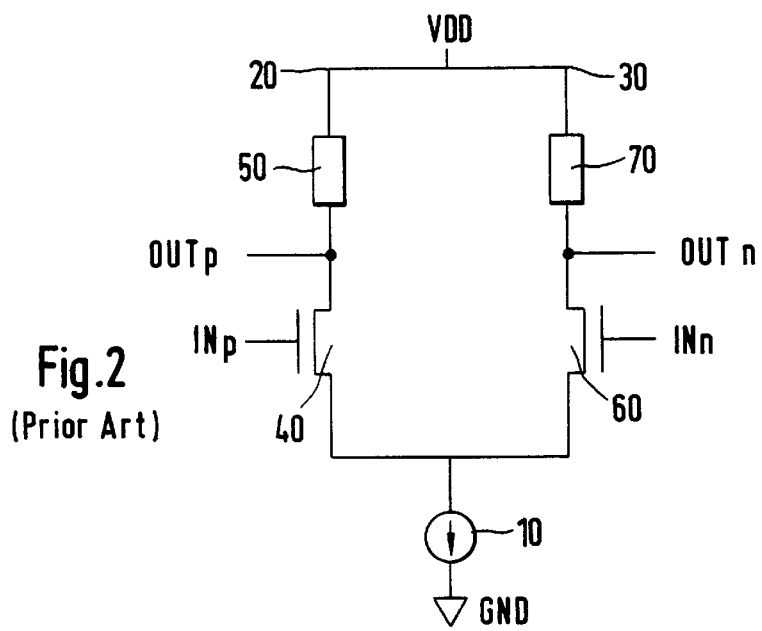
FIG. 2 shows an inverter circuit as known in the art.
Figure 3:
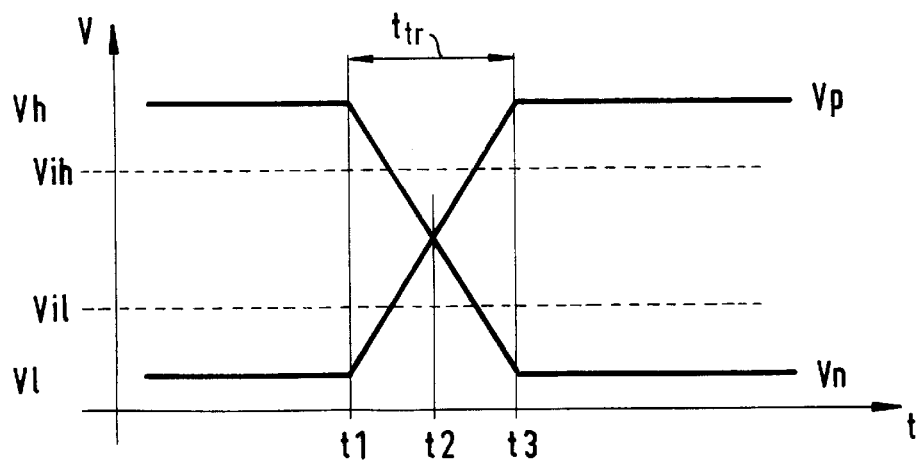
FIG. 3 shows an example for a state transition in a differential circuit.
Figure 4A:
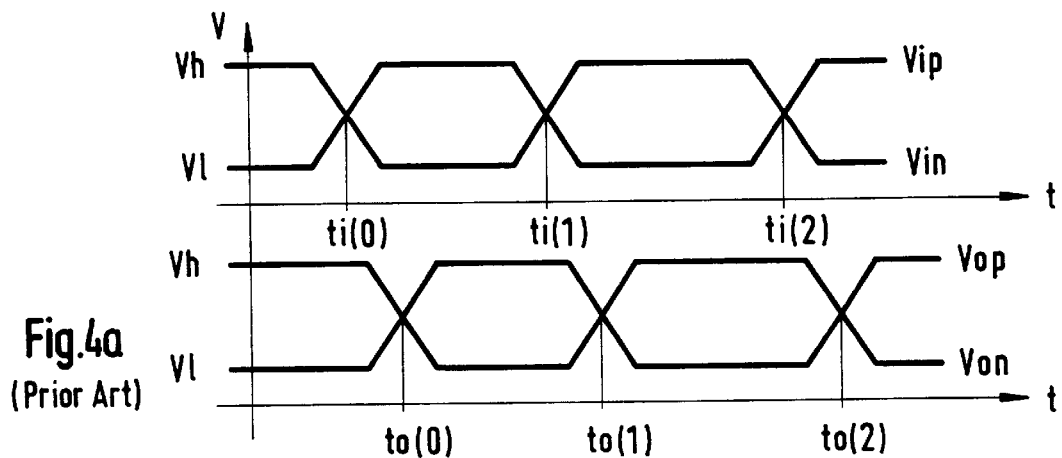
FIGS. 4a and 4b depict differential input and output state transitions.
Figure 4B:
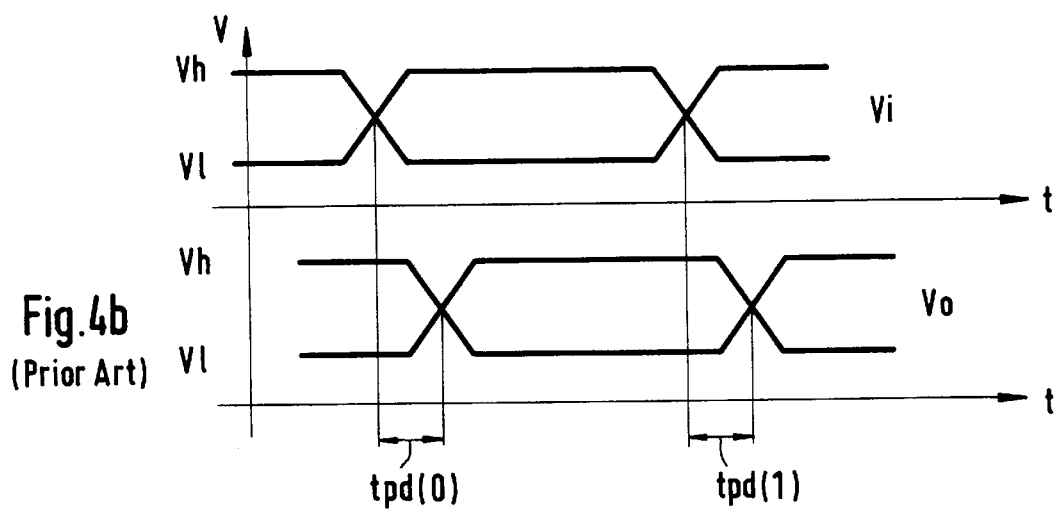
Figure 5:
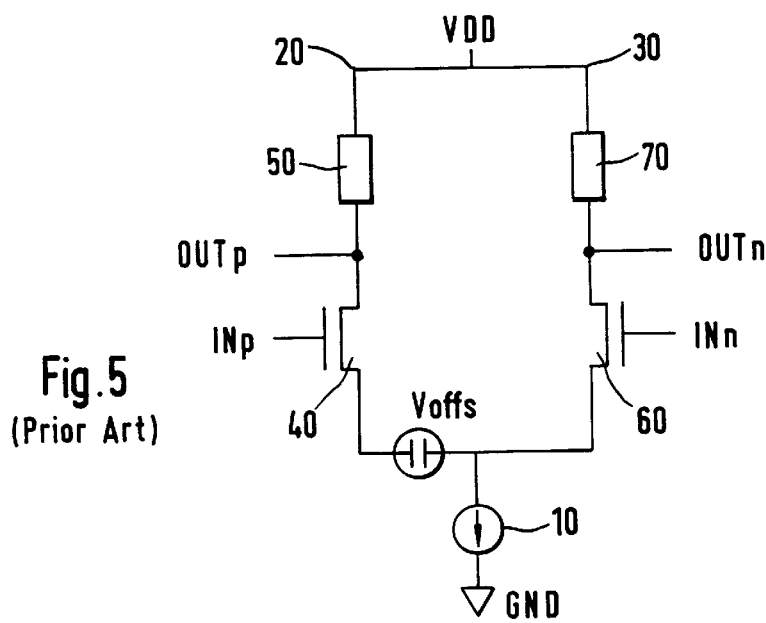
FIG. 5 depicts the inverter of FIG. 2 with an offset voltage $V_{offs}$ due to an asymmetry.
Figure 8B:
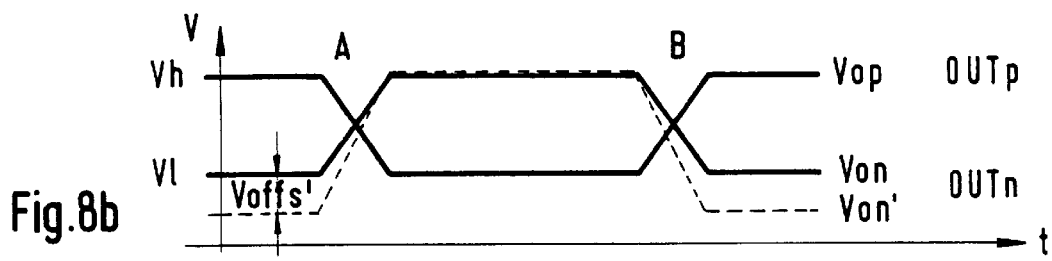
Figure 9A:
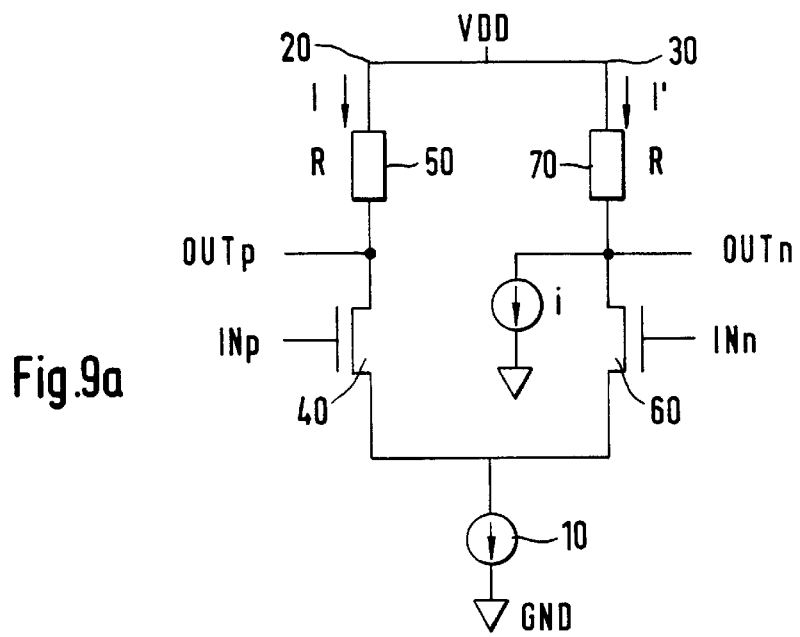
FIGS. 9a and 9b shows the principle and effect for adjusting at least one current I' in one current path of the inverter circuit of FIG. 2, according to the invention.
Figure 9B:
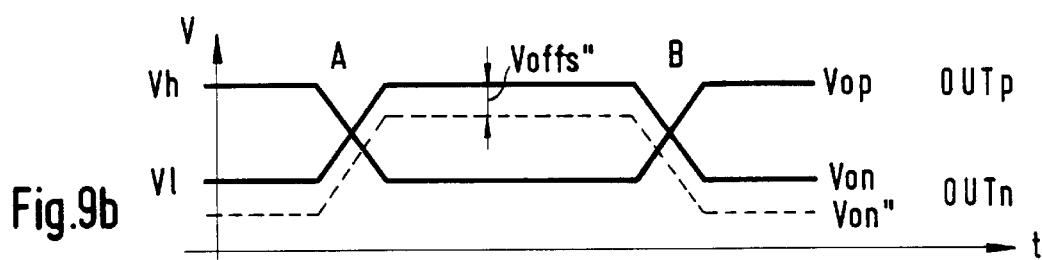
Figure 9C:
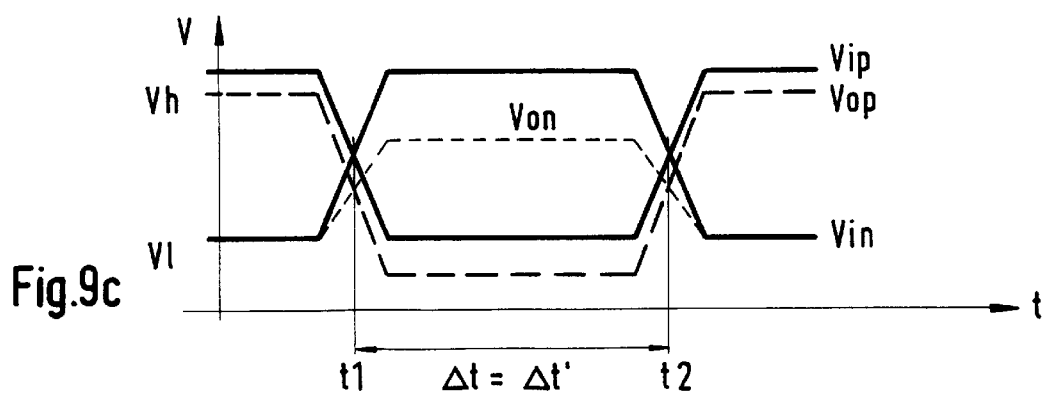
FIG. 9c depicts in an example the principle for the timing adjustment according to the invention, FIGS. 10a,b and 11a,b show trimming circuits according to embodiments of the invention.

Embodiments for adjusting differential circuits according to the invention are given the following for the example of the inverter circuit of FIG. 2. The adjusting involves modifying the operating point of the differential circuit such that differences in the propagation delay can be removed. Although the embodiments are depicted in MOS technology, it is to be understood that the invention is not limited thereto, but any differential circuit implemented in any technology can be adjusted accordingly.

Figure 10A:
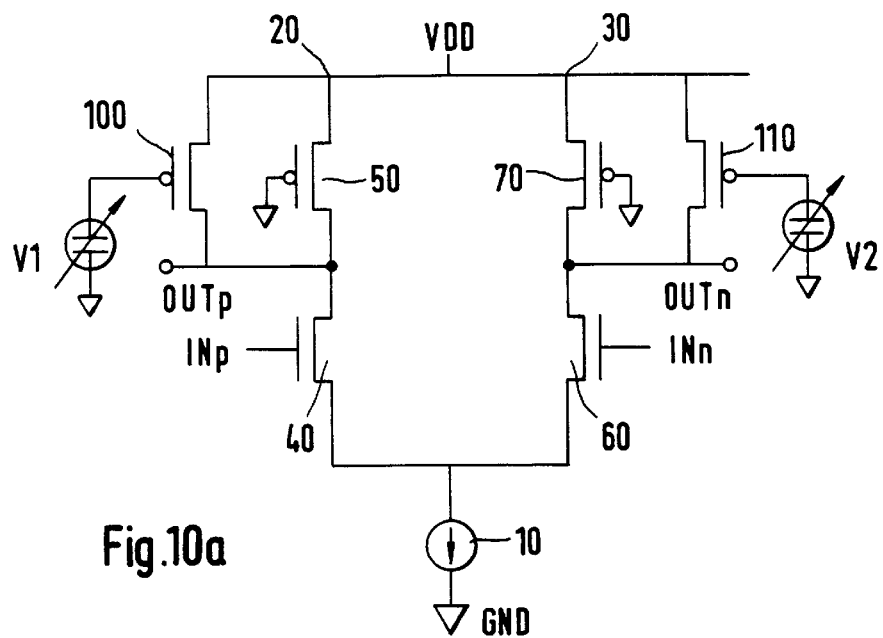

FIG. 10a shows an example for adjusting the inverter circuit of FIG. 2, following the first principle way for a trimming circuit, wherein at least one impedance R in at least one of the current paths is modified. The first load 50 of the first current path 20 and the second load 70 of the second current path 30 are embodied as transistors, whereby the impedances thereof are respectively set by control voltages applied to their gate electrodes. In parallel to at least one of the first load 50 and to the second load 70 (and preferably to both) is connected an impedance means 100 (and 110). The impedance means 100 and 110 are preferably embodied as transistors, whereby the impedances thereof can be respectively set by control voltages $V_1$ and $V_2$ applied to their control (gate) electrodes. The control voltages $V_1$ and $V_2$ may be embodied by analog voltage sources or by other voltage supplying means as known in the art.

Figure 10B:
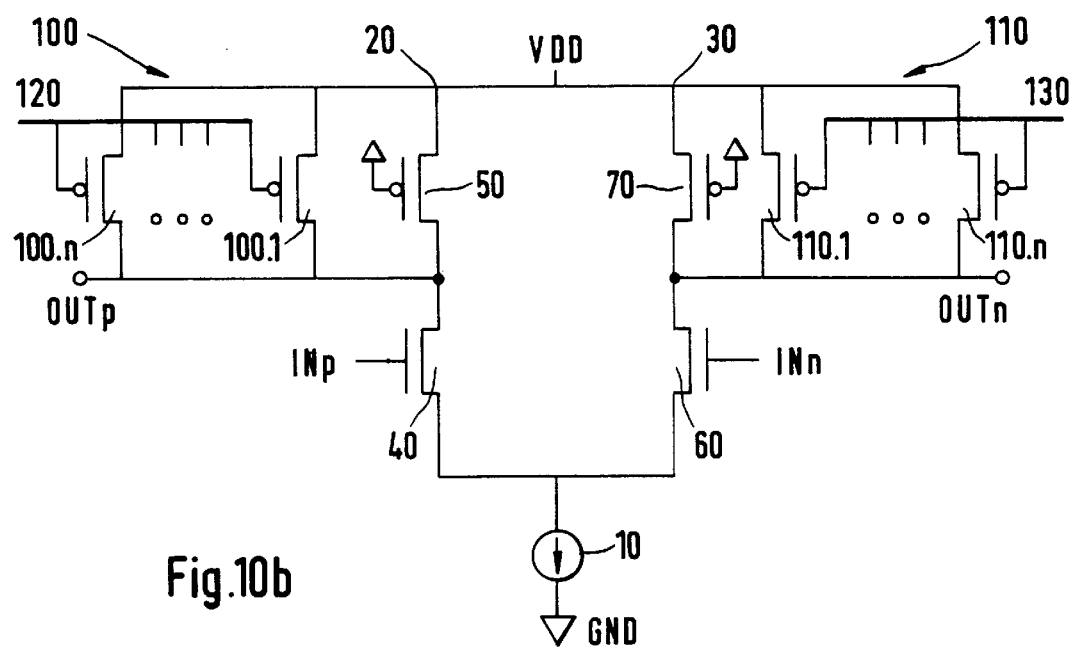

FIG. 10b shows an example for embodying the impedance means 100 and 110. The impedance means 100 and 110 are respectively implemented as a plurality of transistors 100.1 , . . . , 100.n and 110.1 , . . . , 110.n arranged in a parallel connection. The impedance of each one of the impedance means 100 and 110 can be set by applying control voltages to the control (gate) electrodes of the plurality of transistors 100.1 , . . . , 100.n and 110.1 , . . . , 110.n. In one embodiment, the ground (0V) or higher potential (VDD) voltages (rail voltages) are applied as the control voltages for the control electrodes.

In a preferred embodiment, the impedance means 100 and 110 are implemented as a plurality of parallel transistors 100.1 , . . . , 100.n and 110.1 , . . . , 110.n, allowing a digital controlling of the impedance means 100 and 110. The control (gate) electrodes of the plurality of transistors 100.1

, . . . , 100.n are coupled to a control bus 120, and the control (gate) electrodes of the plurality of transistors 110.1 , . . . , 110.n are coupled to a control bus 130. The control busses 120 and 130 supply digital signals to the plurality of transistors 100.1 , . . . , 100.n and 110.1 , . . . , 110.n which either turn the transistors on or off, thus modifying the impedance of the impedance means 100 and 110.

Figure 11A:
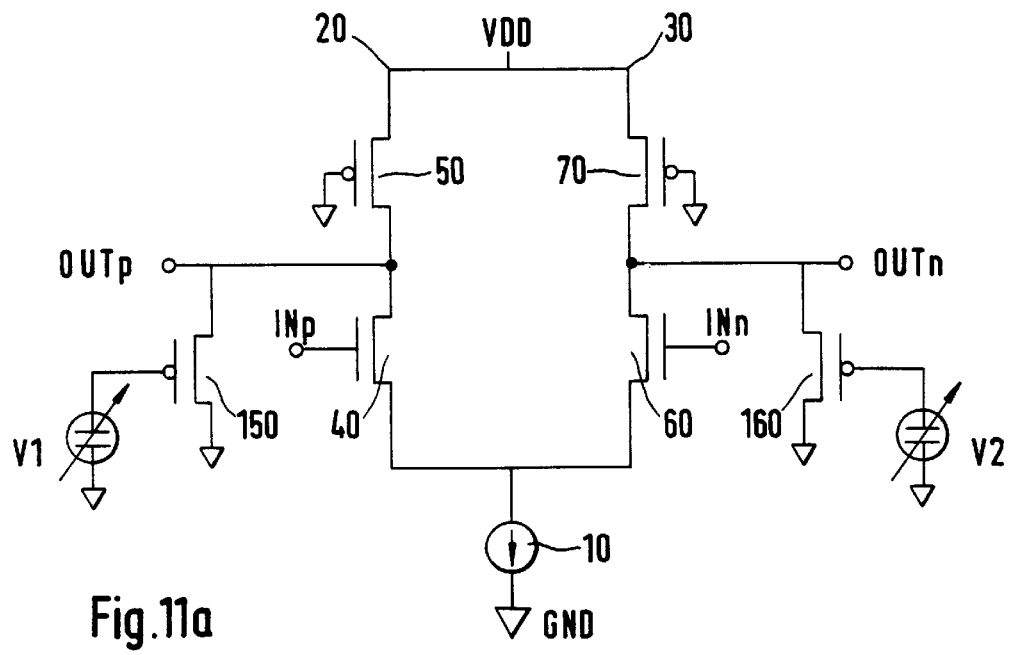

FIG. 11 a shows an example for adjusting the inverter circuit of FIG. 2, following the second principle way for a trimming circuit, wherein at least one current I in at least one of the current paths is modified. A first current source 150 couples to one of the output nodes $OUT_p$ or $OUT_n$. Preferably, a second current source 160 couples to the other one of the output nodes $OUT_p$ or $OUT_n$. The first 150 and second 160 current sources are preferably embodied as transistors, whereby the value of the currents applied to the respective output nodes $OUT_p$ or $OUT_n$ can be set by control voltages $V_1$ and $V_2$ respectively applied to their control (gate) electrodes. The control voltages $V_1$ and $V_2$ may be embodied by analog voltage sources or by other voltage supplying means as known in the art.

Figure 11B:
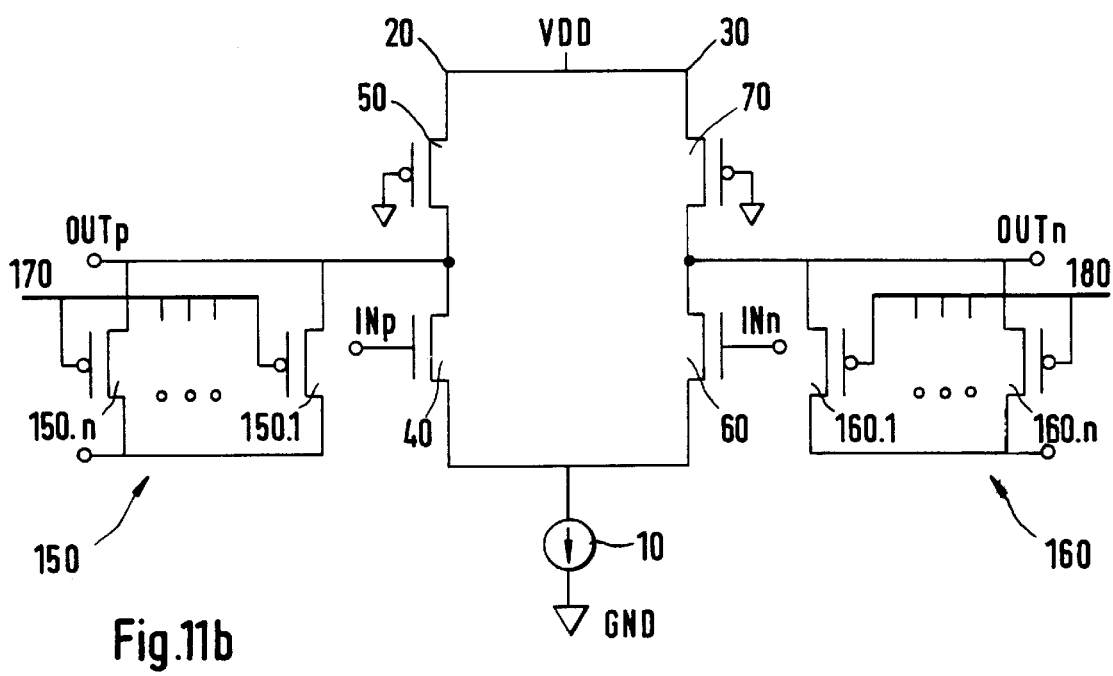

FIG. 11b shows an example for embodying the first 150 and second 160 current sources, respectively implemented as a plurality of transistors 150.1 , . . . , 150.n and 160.1 , . . . , 160.n arranged in a parallel connection. The values of the currents supplied by the first 150 and second 160 current sources can be set by applying control voltages to the control (gate) electrodes of the plurality of transistors 150.1 , . . . , 150.n and 160.1 , . . . , 160.n.

In a preferred embodiment, the first 150 and second 160 current sources are implemented as controllable current-output digital-to-analog converters (CCO-DAC) 150 and 160, whereby the control (gate) electrodes of the plurality of transistors 150.1 , . . . , 150.n are coupled to a control bus 170, and the control (gate) electrodes of the plurality of transistors 160.1 , . . . , 160.n are coupled to a control bus 180. The control busses 170 and 180 supply digital signals to the plurality of transistors 150.1 , . . . , 150.n and 160.1 , . . . , 160.n which either turn the transistors on or off, thus modifying the values of the currents supplied by the first 150 and second 160 current sources.

The first 150 and second 160 current sources are preferably connected between the output nodes $OUT_p$ or $OUT_n$ and a lower potential such as ground potential. In that case, currents i are only 'drawn' from the respective current path of the differential circuit, allowing an easier implementation.

The CCO-DACs 150 and 160 are preferably embodied by six binary weighted current sources. These current sources, which can be switched on and off individually to adjust the magnitude of the current, are preferably implemented as NMOS FETs when the source connectors of these FETs are connected to a lower (ground) potential. On the other hand, when the drain connectors of these transistors are connected to a higher potential, the current sources are preferably implemented as PMOS FETs. The gate connectors are preferably driven by six digital signals controlling the current flow through the transistors. The digital signals can switch the currents on or off. The current load presented to the output nodes $OUT_p$ or $OUT_n$ is the sum of the six individual currents.

The impedance means 100 and 110 and the first 150 and second 160 current sources can be built up accordingly, whereby preferably one contact thereof couples to the output node $OUT_p$ or $OUT_n$. In order to change the propagation delay through the differential circuit, the two output nodes $OUT_p$ or $OUT_n$ are preferably loaded differently. The programmable impedance means 100.1 , . . . , 100.n or 110.1 , . . . , 110.n or CCO-DACs 150 and 160 may preferably be programmed so that the digital input signals on each side are inverted.

We claim:

1. A method for adjusting a propagation delay of both positive and negative signal transitions through a differential circuit, said differential circuit comprising two substantially symmetrical current paths, each current path including a semiconductor device and an impedance, the method comprising the steps of:

(a) applying a defined input signal having positive and negative transitions with known timing characteristics to an input of at least one said semiconductor device, (b) comparing timing characteristics of a resulting output signal with the timing characteristics of the input signal, and (c) modifying at least one voltage level in at least one said current path to adjust an offset voltage in said current path and, as a result, a signal transition propagation delay through the differential circuit, until the timing characteristics of the output signal and input signal substantially match.

2. The method according to claim 1, wherein:

in step (a): the applied input signal has a defined duty cycle signal of about 50%;

in step (b): the duty cycle of the output signal is measured and compared with the duty cycle of the input signal; and in step (c): the at least one voltage level in at least one of the current paths is modified until the duty cycle of the input and the output signals at least substantially match.

* * * * *